US011656300B2

(12) United States Patent
Mather et al.

(10) Patent No.: US 11,656,300 B2
(45) Date of Patent: *May 23, 2023

(54) MAGNETIC FIELD SENSOR WITH INCREASED SNR

(71) Applicant: EVERSPIN TECHNOLOGIES, INC., Chandler, AZ (US)

(72) Inventors: Phillip G. Mather, Phoenix, AZ (US); Anuraag Mohan, Fremont, CA (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 235 days.

This patent is subject to a terminal disclaimer.

(21) Appl. No.: 17/022,460

(22) Filed: Sep. 16, 2020

(65) Prior Publication Data

US 2020/0408858 A1 Dec. 31, 2020

Related U.S. Application Data

(63) Continuation of application No. 15/141,461, filed on Apr. 28, 2016, now Pat. No. 10,809,320.

(60) Provisional application No. 62/156,013, filed on May 1, 2015, provisional application No. 62/154,210, filed on Apr. 29, 2015.

(51) Int. Cl.
*G01R 33/09* (2006.01)
(52) U.S. Cl.
CPC .......... *G01R 33/093* (2013.01); *G01R 33/098* (2013.01)
(58) Field of Classification Search
CPC ..... G01R 33/098; G01R 33/093; G01R 33/09
See application file for complete search history.

(56) References Cited

U.S. PATENT DOCUMENTS

| 5,508,868 | A | 4/1996 | Cheng et al. |
| 5,654,566 | A | 8/1997 | Johnson |
| 5,701,222 | A | 12/1997 | Gill et al. |
| 6,384,600 | B1 | 5/2002 | Coehoorn |
| 6,385,079 | B1 | 5/2002 | Tran |
| 2003/0214762 | A1 | 11/2003 | Sharma et al. |
| 2005/0073883 | A1* | 4/2005 | Anthony ............... G11C 11/16 365/171 |
| 2009/0073616 | A1 | 3/2009 | Shimazawa et al. |
| 2010/0213933 | A1 | 8/2010 | Mather et al. |
| 2011/0025322 | A1 | 2/2011 | Yamazaki et al. |
| 2011/0074406 | A1 | 3/2011 | Mather et al. |

(Continued)

OTHER PUBLICATIONS

International Search Report and Written Opinion issued in corresponding International Application No. PCT/US16/30161, dated Sep. 23, 2016 (11 pages).

(Continued)

*Primary Examiner* — Son T Le
*Assistant Examiner* — Adam S Clarke
(74) *Attorney, Agent, or Firm* — Bookoff McAndrews, PLLC

(57) ABSTRACT

Various means for improvement in signal-to-noise ratio (SNR) for a magnetic field sensor are disclosed for low power and high resolution magnetic sensing. The improvements may be done by reducing parasitic effects, increasing sense element packing density, interleaving a Z-axis layout to reduce a subtractive effect, and optimizing an alignment between a Z-axis sense element and a flux guide, etc.

20 Claims, 9 Drawing Sheets

(56) References Cited

U.S. PATENT DOCUMENTS

| | | | |
|---|---|---|---|
| 2011/0147816 A1* | 6/2011 | Nikonov | H01L 27/22 |
| | | | 257/295 |
| 2013/0264666 A1* | 10/2013 | Sun | G01R 33/09 |
| | | | 257/421 |
| 2014/0138346 A1 | 5/2014 | Whig et al. | |
| 2015/0108972 A1 | 4/2015 | Zimmer et al. | |
| 2016/0320460 A1 | 11/2016 | Mather et al. | |

OTHER PUBLICATIONS

AN215 Application Note, "Cross Axis Effect For AMR Magnetic Sensors," Honeywell Sensor Products, Solid State Electronics Center, 4 pages.

International Preliminary Report on Patentability and Written Opinion issued in corresponding International Application No. PCT/US2016/030161, dated Oct. 31, 2017 (7 pages).

* cited by examiner

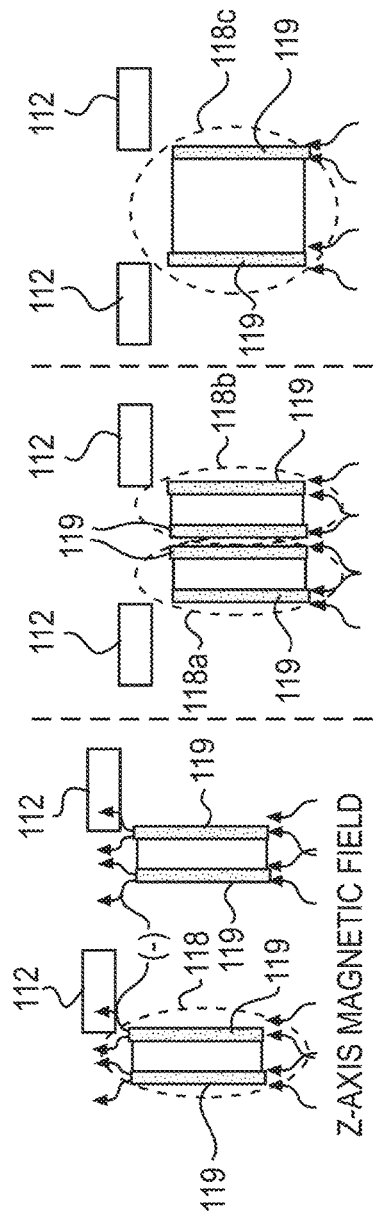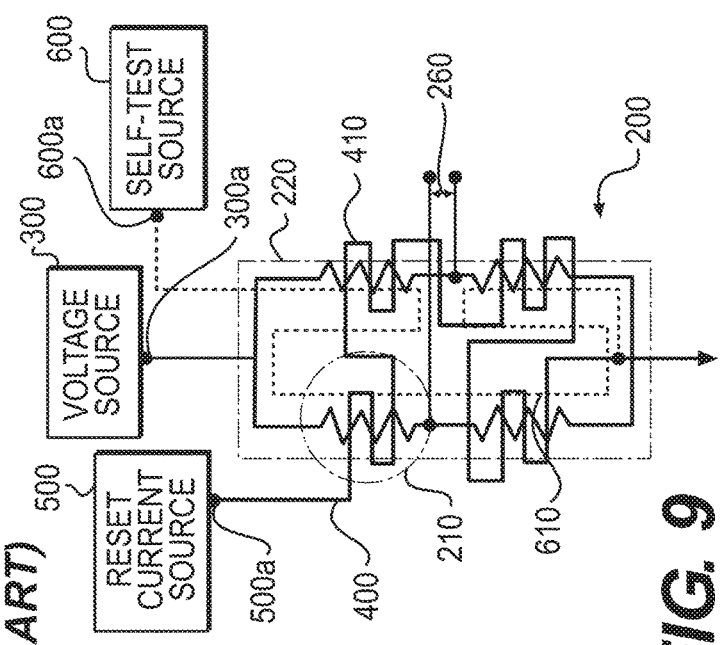

X/Y AXIS CONFIGURATION

X/Y AXIS CONFIGURATION

Z AXIS CONFIGURATION

Z AXIS CONFIGURATION

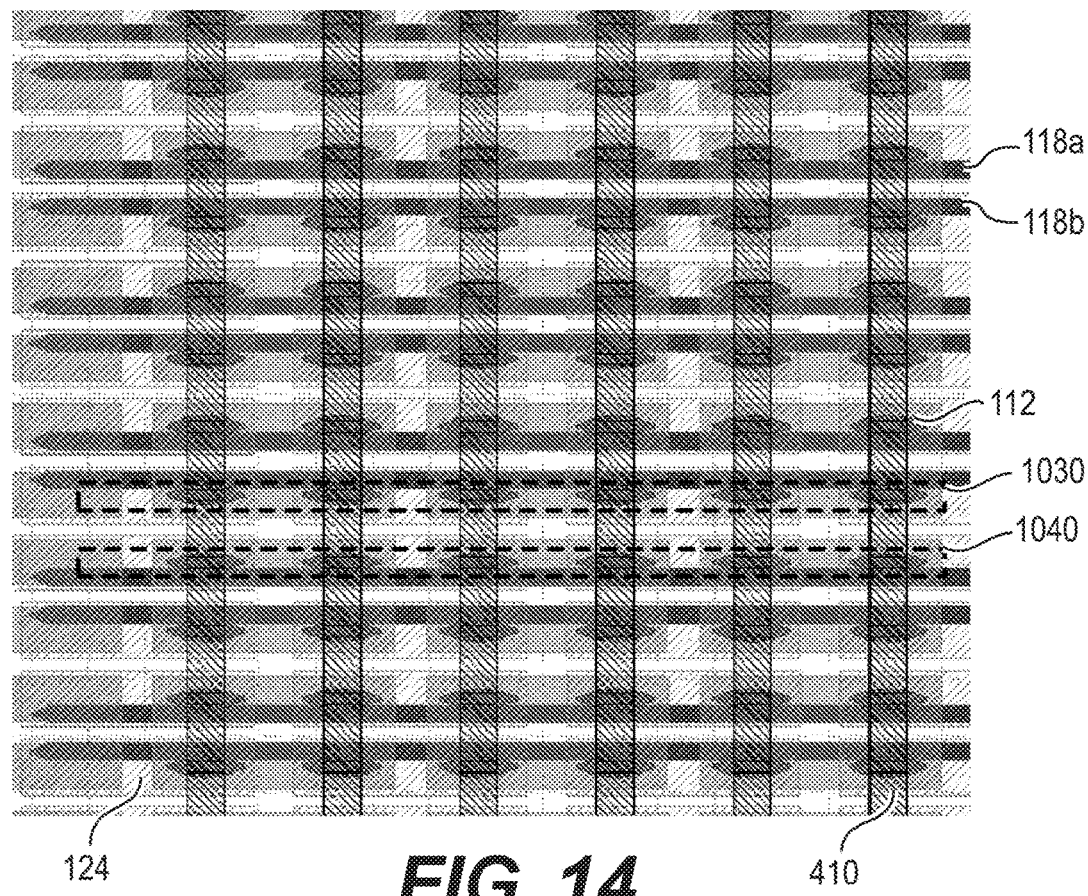
FIG. 14
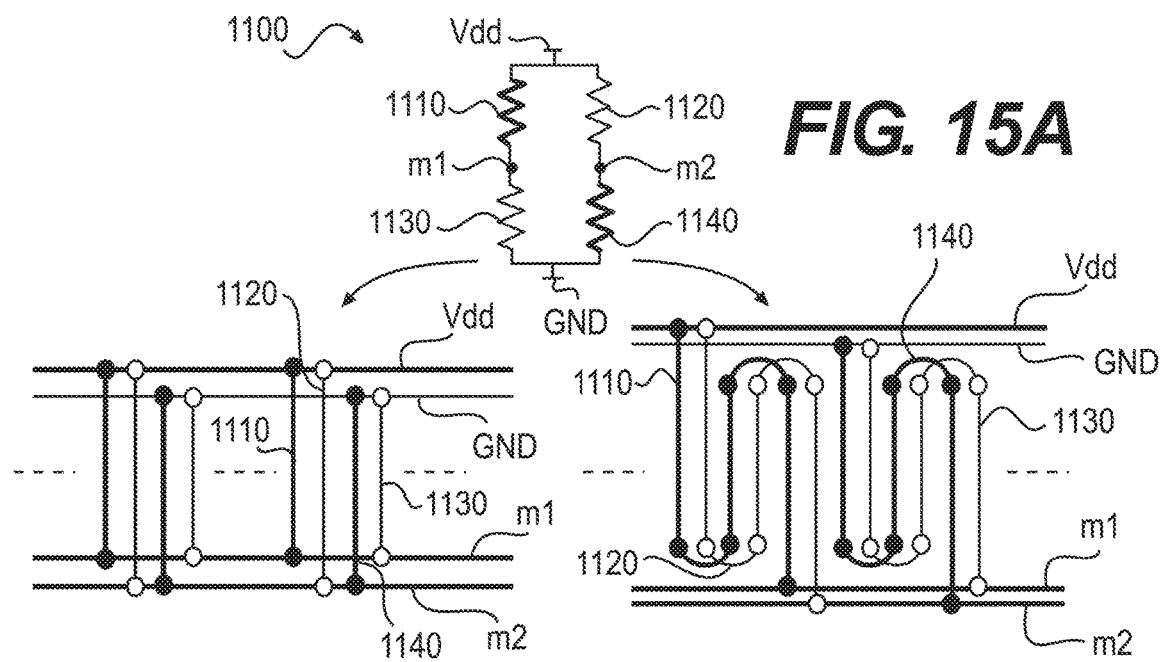
FIG. 15A
FIG. 15B
FIG. 15C

MAGNETIC FIELD SENSOR WITH INCREASED SNR

CROSS REFERENCE TO RELATED APPLICATIONS

This application is a continuation of U.S. Nonprovisional patent application Ser. No. 15/141,461 filed on Apr. 28, 2016, which claims the benefit of priority to U.S. Provisional Application No. 62/156,013, filed May 1, 2015, and U.S. Provisional Application No. 62/154,210, filed Apr. 29, 2015, the entire contents of which are herein incorporated by reference.

TECHNICAL FIELD

The present inventions relate generally to the field of magnetic field sensors and more particularly to methods of increasing signal-to-noise ratio (SNR) of magnetic field sensors.

BACKGROUND OF THE INVENTION

Magnetic field sensors have been commonly used in various electronic devices, such as computers, laptops, media players, smart phones, etc. There are several techniques/devices that can be used for detecting a magnetic field. Tunneling Magnetoresistance (TMR) is a promising magnetic sensing technology for handset applications due to its advantages in sensitivity, power, and process cost compared with other magnetic sensors. Another closely related technology in magnetic field sensing is Giant Magnetoresistance (GMR), and many of the disclosed embodiments apply equally well to GMR based sensing technologies.

A TMR element is composed of two ferromagnetic layers separated by a non-magnetic, insulating tunnel barrier. One layer has a magnetization direction that is "free" to rotate in a magnetic field. The other layer (reference layer) has a "fixed," reference magnetization that does not rotate when in a magnetic field of moderate to low strength that is of sensing interest. If the magnetization directions of the two layers are parallel to each other, the electrical resistance of the tunnel barrier is low. Conversely, when the magnetization directions are anti-parallel, the resistance is high. A magnetic field sensor based on TMR therefore converts magnetic field into electrical signal by a change in electrical resistance due to the changing angle of the magnetization direction of the magnetic free layer relative to the reference magnetization of the fixed layer in response to the field.

The performance of a magnetic sensor may be defined by its signal-to-noise ratio (SNR). Magnetic sensors with high SNR need high power for operation to achieve desired output signal quality and generally are not applicable to situations where high precision magnetic field measurement is required.

Therefore, it would be desirable to have a system, device, and method to effectively increase a signal-to-noise ratio (SNR) of magnetic field sensors for lower power and high resolution magnetic sensing.

SUMMARY OF THE INVENTION

Certain embodiments of the inventions provide for systems, devices, and methods to effectively increase a SNR of a TMR magnetic field sensor for low power, high resolution magnetic sensing.

According to various embodiments of the inventions, various means for improvement in a SNR for a TMR field sensor are disclosed. The improvement may be done by reducing parasitic effects, increasing sense element packing density, interleaving a Z-axis layout to reduce a subtractive effect, and optimizing an alignment between a Z-axis sense element and a flux guide, etc.

In certain embodiments, a magnetic sensor is built with a Wheatstone bridge circuit with each leg comprising an identical number of sense elements. Such a design may avoid a differential response to in-plane fields since all elements respond in the same way. Moreover, an even number of sense elements, preferably 4 sense elements, per metal magnetic tunnel (MMT) is utilized for a balanced sense current flow (e.g., equal SNR weighting for each sense element), and the sense current flows vertically through the magnetic tunnel junction (MTJ) sense elements and perpendicular to an MMT orientation, which interconnects adjacent sense elements for minimal resistive losses.

In certain embodiments, for Z-axis magnetic sensing, a Z-axis layout is interleaved to take advantage of both sides of a flux guide. Preferably, dual flux guides are utilized for an optimal trench width while maintaining pitch and spacing constraints of a reference layer within a TMR sense element. Sense elements may also be used on both sides of a flux guide to eliminate the subtractive effect that is present when the inactive ferromagnetic side of one trench is close enough to interact with a side of an adjacent sense element column. Adjacent sense elements may be arranged to have an opposite response to an out-of-plane field, and hence, Z-axis sensor legs become interleaved with one another to allow for denser packing, a relatively higher sense element occupation area, and a relatively higher SNR without impacting sensitivity due to the aforementioned subtractive effect.

In certain embodiments, built-in reset lines within the TMR sensor are routed at a 45 degree cross angle to the easy (long) axis of a magnetic sense element to lower a switching threshold by about a factor of two, as compared to a 90 degree cross angle reset line routing. Furthermore, the reset lines within the TMR sensor may be utilized in a bipolar chopping method in combination with the aforementioned means to further lower sensor output signal noise.

While the present inventions are discussed below using TMR magnetic fields sensors having TMR elements, all aspects of the inventions will directly apply to devices based on giant magnetoresistance (GMR) technology as well. The inventions disclosed here also apply to any magnetic sensing technology that utilizes soft-magnetic films for sensing magnetic fields, such as, for example, anisotropic magnetoresistance (AMR), Fluxgate, and Hall sensors with a flux concentrator. For simplicity and clarity, the inventions will be described in more detail below using TMR technology as an example.

BRIEF DESCRIPTION OF THE DRAWINGS

Reference will be made to exemplary embodiments of the present inventions that are illustrated in the accompanying figures. Those figures are intended to be illustrative, rather than limiting. Although the present inventions are generally described in the context of those embodiments, it is not intended by so doing to limit the scope of the present inventions to the particular features of the embodiments depicted and described.

FIGS. 8A-8C show cross-section views of Z-axis TMR sense element cells and flux guides according to various embodiments of the inventions.

FIG. 9 depicts an exemplary structure overview of a TMR magnetic field sensor comprising a bridge circuit with multiple TMR transducer legs according to various embodiments of the inventions.

FIG. 14 depicts an exemplary structure diagram of an array of Z-axis TMR element cells according to various embodiments of the inventions.

FIGS. 15A-15C depict exemplary schematic diagrams of an array of Z-axis TMR element cells according to various embodiments of the inventions.

Figure 1:
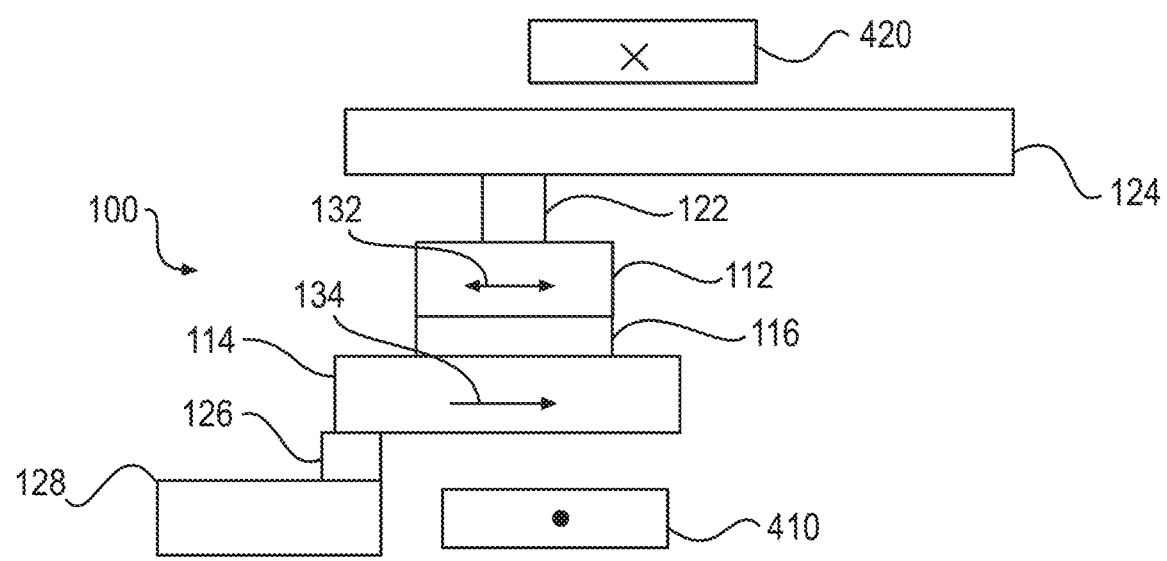
FIG. 1 depicts a cross-section view of a single TMR element cell, according to various embodiments of the inventions.

One skilled in the art will recognize that various implementations and embodiments of the inventions may be practiced in accordance with the specification. All of these implementations and embodiments are intended to be included within the scope of the inventions.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION OF THE PREFERRED EMBODIMENTS

In the following description, for the purpose of explanation, specific details are set forth in order to provide an understanding of the present inventions. The present inventions may, however, be practiced without some or all of these details. The embodiments of the present inventions described below may be incorporated into a number of different electrical components, circuits, devices, and systems. Structures and devices shown in block diagram are illustrative of exemplary embodiments of the present inventions and are not to be used as a pretext by which to obscure broad teachings of the present inventions. Connections between components within the figures are not intended to be limited to direct connections. Rather, connections between components may be modified, re-formatted, rerouted, or otherwise changed by intermediary components.

When the specification makes reference to "one embodiment" or to "an embodiment", it is intended to mean that a particular feature, structure, characteristic, or function described in connection with the embodiment being discussed is included in at least one contemplated embodiment of the present inventions. Thus, the appearance of the phrase, "in one embodiment," in different places in the specification does not constitute a plurality of references to a single embodiment of the present inventions.

Various embodiments of the inventions are used for systems, devices, and methods to effectively increase the SNR of a TMR magnetic field sensor and maintain desired measurement sensitivity. The TMR magnetic field sensors, and the TMR element(s) therein, may be integrated on a single component or contain discrete components. Furthermore, embodiments of the inventions are applicable to a diverse set of techniques and methods.

As mentioned above, the magnetic field sensors as claimed herein may mean one or more of TMR magnetic fields sensors, GMR magnetic field sensors, AMR magnetic field sensors, Fluxgate magnetic field sensors, and/or Hall magnetic field sensors with a flux concentrator. Further, magnetoresistance sense elements as claimed herein may mean one or more of TMR elements, GMR elements, AMR elements, Fluxgate elements, and/or Hall elements with flux concentrators.

FIG. 1 illustrates a cross-section view of a single TMR element cell 100, according to various embodiments of the inventions. The TMR element cell 100 is composed of a first patterned ferromagnetic layer 112 and a second ferromagnetic layer 114 separated by a non-magnetic, insulating tunnel barrier 116 (also called a tunnel junction (TJ)). In one embodiment, the first layer 112 (also referred as sense element) has a magnetization direction 132 that is free to rotate in a magnetic field. The second layer 114 (reference layer) has a fixed reference magnetization direction 134 that does not rotate when in a magnetic field. If the magnetization directions of the two layers are parallel to each other, the electrical resistance of the tunnel barrier 116 is relatively low. Conversely, when the magnetization directions are antiparallel, the resistance is relatively higher.

The TMR element cell 100 therefore converts a magnetic field into electrical signal by changing the electrical resistance due to a changing angle of the magnetization direction 132 of the magnetic free layer relative to the reference magnetization direction 134 of the fixed layer in response to the field. The ferromagnetic layers 112 and 114 may be formed from any suitable ferromagnetic material, such as Ni, Fe, Co, or their alloys. The insulating tunnel barrier 116 may be composed of insulator materials such as AlOx, MgOx, ZrOx, TiOx, HfOx, or any combinations thereof.

Typically, the first ferromagnetic layer 112 is connected to a first conductive line 124 by a first contact 122, and the second ferromagnetic layer 114 is connected to a second conductive line 128 by a second contact 126, which may contact from above as well as below the second ferromagnetic layer 114. The second conductive line 128 may also be referred as metal magnetic tunnel (MMT) layer. In one embodiment, the first conductive line 124 and the second conductive line 128 may connect to other TMR element cells 100 to form a TMR element cell array.

In one embodiment, the TMR element cell 100 comprises a built-in current line 410 located, disposed, or deposited adjacent to the second ferromagnetic layer 114 to carry a reset current. The current line 410 of one TMR element cell 100 may be coupled to current lines of multiple other TMR element cells. In another embodiment, the TMR element cell 100 also comprises a second built-in current line 420 located, disposed, or deposited adjacent to the first ferromagnetic layer 112. The first ferromagnetic layer 112 is patterned into a shape that has a long axis and a short axis. In a zero magnetic field, the magnetization direction of the first ferromagnetic layer 112 lies along the long axis of the element 100, and can be directed in either of the two directions along this axis. By applying a reset current signal to the current line 410 and/or the current line 420, an induced magnetic field is generated in an ambient area surrounding the respective current line 410/420. Since the first layer 112 has a magnetization direction 132 that is free to rotate and switch, the magnetization direction 132 will switch to be along the direction projected on its axis by the induced magnetic field. As an exemplary illustration in FIG. 1, when the current in the current line 410 has a direction pointing outward (relative to the page) and the current in the current line 420 has a direction pointing inward (relative to the page), the magnetization direction 132 points leftward, which is has a component that is negatively aligned to the reference magnetization direction 134, and will switch the magnetization direction 132 of the free layer to the left; when the current in the current line 410 has a direction pointing inward and/or the current in the current line 420 has a direction pointing outward, the magnetization direction 132 points rightward, which has a component that is positively aligned to the reference magnetization direction 134, and will switch the magnetization direction 132 of the free layer to the right.

Figure 6:
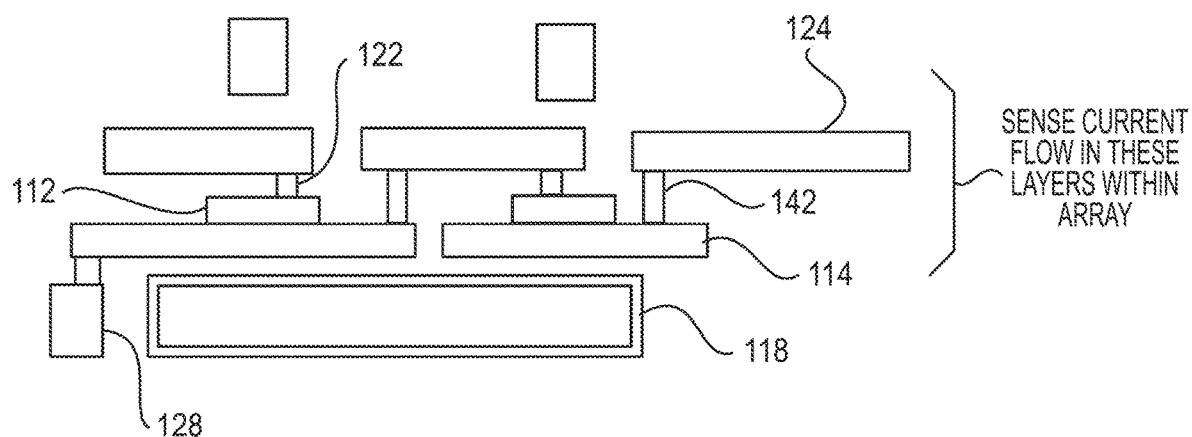
FIG. 6 depicts a prior art cross-section structure overview of typical interconnections of Z-axis TMR element cells.
Figure 7:
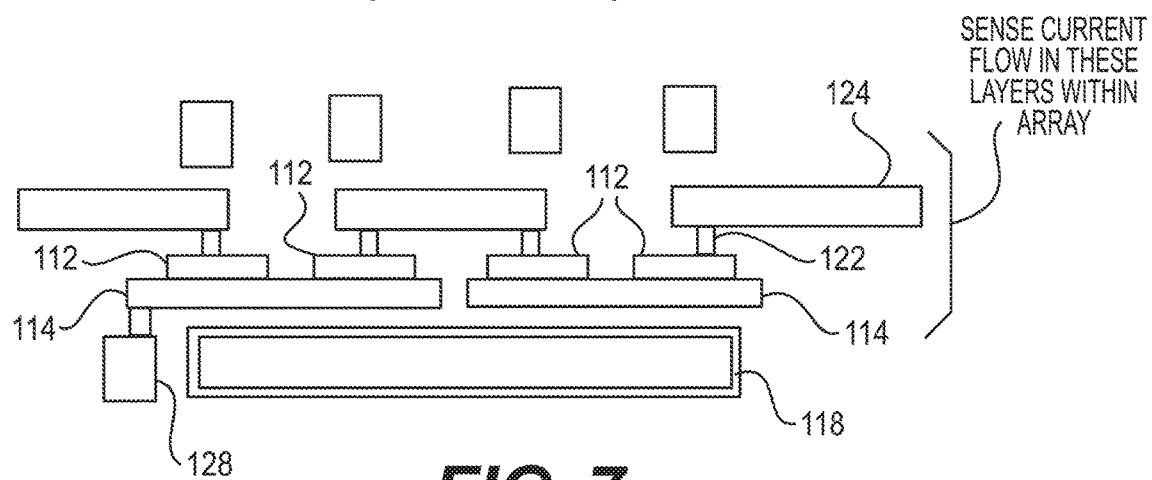
FIG. 7 depicts an exemplary cross-section structure overview of interconnections of Z-axis TMR element cells according to various embodiments of the inventions.

In one embodiment, the TMR element cell 100 comprises at least one built-in flux guide (not shown in FIG. 1 for figure clarity) for Z-axis magnetic field sensing. The flux guide 118 is shown in FIGS. 3, 6, and 7, and will be described below.

Figure 2:
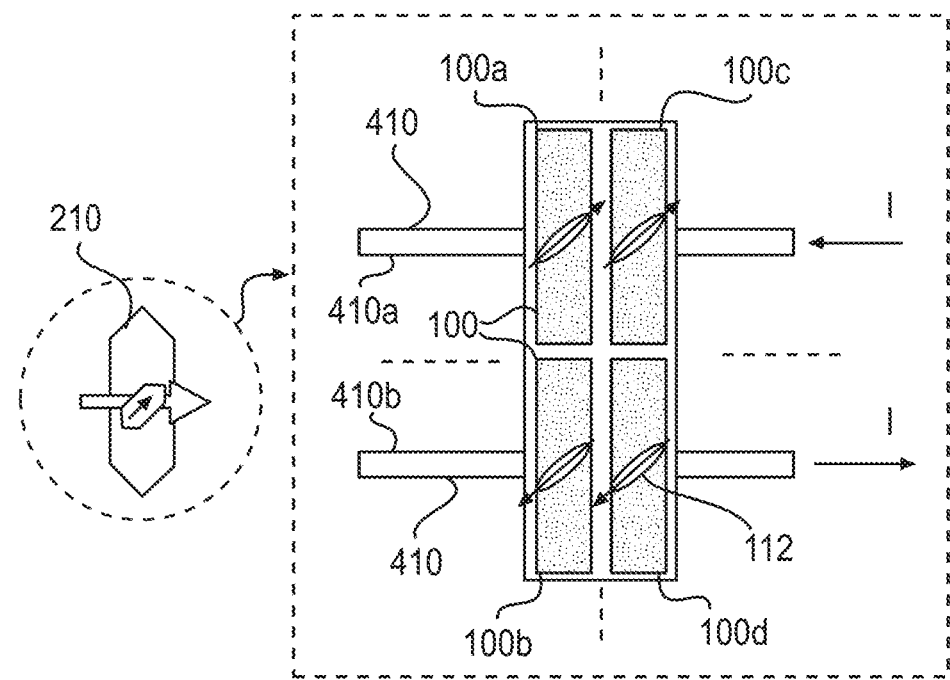
FIG. 2 depicts an exemplary structure overview of a TMR transducer leg, with multiple element cells, according to various embodiments of the inventions.

FIG. 2 depicts an exemplary structure overview of a TMR transducer leg 210, with multiple element cells 100, according to various embodiments of the inventions. The TMR transducer leg 210 comprises an array of multiple active sense element cells 100a-100d, preferably arranged in a matrix layout. In one embodiment, each TMR transducer leg 210 comprises an array of 24×24 sense element cells 100, which is approximately 100×100 um$^2$ in size overall. The current flow in current lines 410a and 410b of each sense element cell 100 may or may not be the same direction. It is understood that the structure shown in FIG. 2 is only for a general illustration purpose. Various sense element coupling patterns within the array may be implemented other than the pattern disclosed in FIG. 2. In one embodiment, a sense element cell (e.g., cells 100a, 100c) may have the opposite current direction relative to a current line of a neighbor sense element cell (e.g., cells 100b and 100d). For the highest signal-to-noise ratio in a given chip area (the densest packing of sense element cells), multiple TMR element cells 100 may share a common reference layer (such as, for example, a common second ferromagnetic layer 114). In one embodiment, four sense element cells may share the common reference layer for a balanced sense current flow, where each TMR element cell has equal SNR weighting. Such a configuration is shown in the circled region labeled "One MMT" in FIG. 12.

Figure 3:
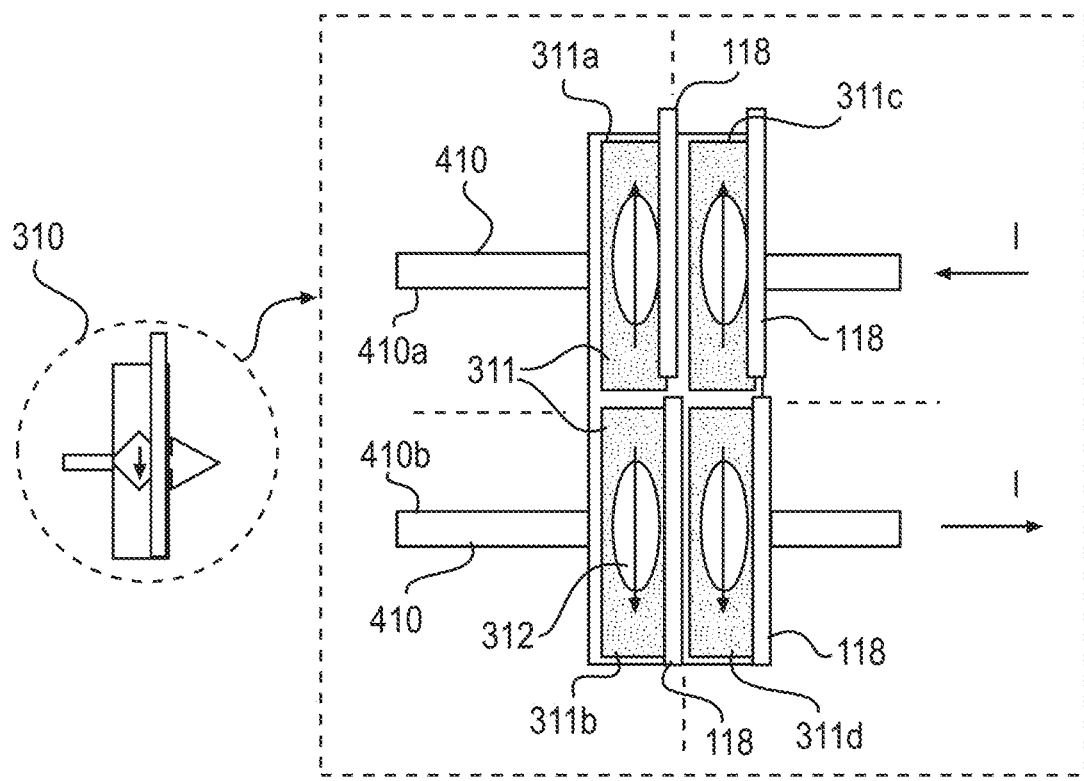
FIG. 3 depicts an exemplary structure overview of a Z-axis TMR transducer leg, with multiple Z-axis TMR element cells, according to various embodiments of the inventions.

FIG. 3 depicts an exemplary structure overview of a Z-axis TMR transducer leg 310, with multiple element cells 311, according to various embodiments of the inventions. Each Z-axis TMR transducer leg 310 comprises an array of multiple active Z-axis TMR element cells 311a-311d, preferably arranged in a matrix layout. In one embodiment, each Z-axis TMR transducer leg 310 comprises an array of 60×40 Z-axis sense elements cells 311, which is approximately 150×200 um$^2$ in size overall. The Z-axis TMR element cells 311 have similar structure as the TMR element cell 100 shown in FIG. 1, except that a Z-axis TMR element cell 311 also comprises at least one flux guide 118. While flux guides 118 are located, disposed, or deposited on the right side and underneath a first ferromagnetic layer 312 of the Z-axis sense elements cells 311 (equivalent to the first ferromagnetic layer 112 shown in FIGS. 1 and 2) as illustrated in FIG. 3, it is understood that flux guides 118 may be located, disposed, or deposited on the left side and/or above the first ferromagnetic layer 312 of the Z-axis sense elements cells 311. The Z-axis sensitivity may be doubled by locating, disposing, or depositing flux guides 118 on opposing sides and planes of the sense element cell 311; i.e., right side, underneath and left side, above. The current flow in current lines 410 of each Z-axis TMR element cell 311 may or may not be the same direction. In one embodiment, a Z-axis sense element cell 311a, 311c may have the opposite current direction relative to the current line of a neighbor Z-axis sense element 311b, 311d.

Figure 4:
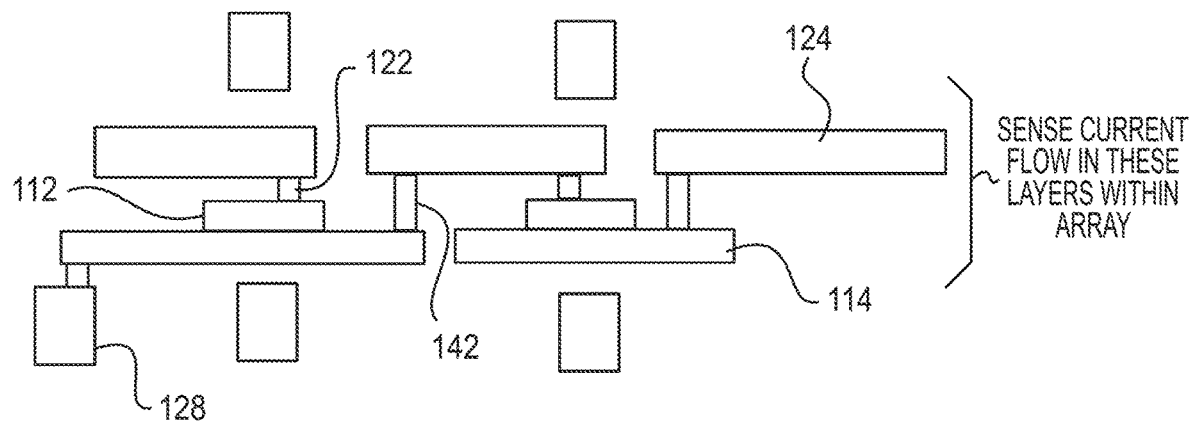
FIG. 4 depicts a prior art cross-section structure overview of typical interconnections of X/Y-axis TMR element cells.

FIG. 4 depicts a prior art cross-section structure overview of typical interconnections of X/Y-axis TMR element cells. Each second ferromagnetic layer 114 (MMT) couples to only one first ferromagnetic layer 112. The TJ 116 is not shown explicitly in FIGS. 4-7. Therefore, a separate via 142 on the second ferromagnetic layer 114 (MMT) has to be used for electrical connection between TMR sense element cells.

Figure 5:
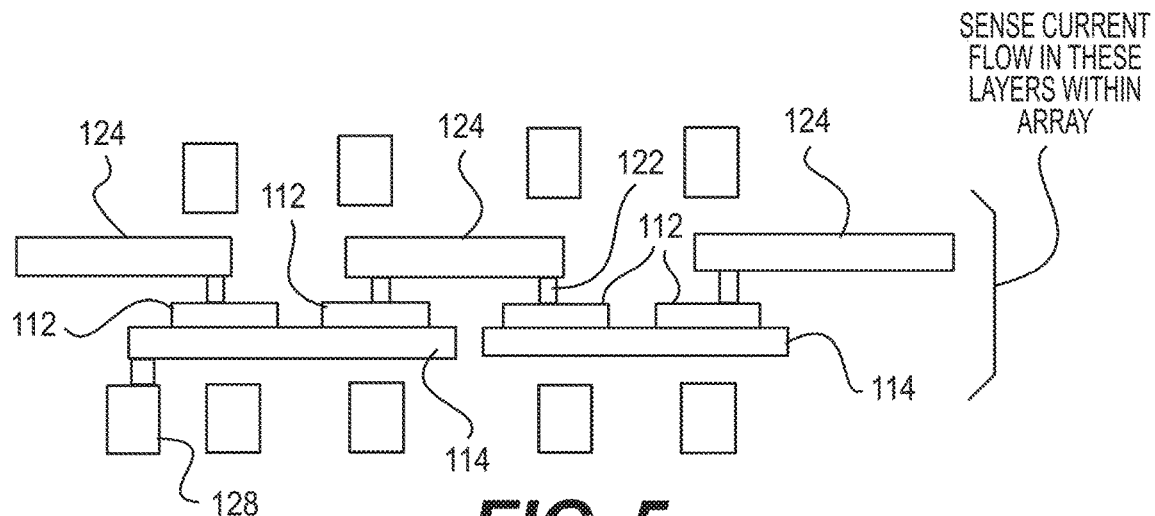
FIG. 5 depicts an exemplary cross-section structure overview of interconnections of X/Y-axis TMR element cells, according to various embodiments of the inventions.

FIG. 5 depicts an exemplary cross-section structure overview of interconnections of X/Y-axis TMR element cells according to various embodiments of the inventions. Compared to FIG. 4, a second ferromagnetic layer 114 (MMT) and an upper conductor layer 124 couple to multiple first ferromagnetic layers 112, and are used directly as a connection conductor for series coupling between TMR sense elements without additional vias or interconnection length. By doing so, the electrical coupling path is lowered significantly, as are the parasitic effects from the coupling path. In a preferred embodiment, each second ferromagnetic layer 114 (MMT) couples to four first ferromagnetic layers 112. In one embodiment, all sense element cells are arranged in a single row or column on the MMT (see, e.g., FIG. 12). Moreover, a sense current flows vertically through the MTJ sense element cells and perpendicular to an MMT orientation, which interconnects adjacent sense element cells for minimal resistive losses.

FIG. 6 depicts a prior art cross-section structure overview of typical interconnections of Z-axis TMR element cells. Similar to FIG. 4, each second ferromagnetic layer 114 (MMT) couples to only one first ferromagnetic layer 112. Therefore, a separate via 142 on the second ferromagnetic layer 114 (MMT) has to be used for electrical connection connections between sense element cells.

FIG. 7 depicts an exemplary cross-section structure overview of interconnections of Z-axis TMR element cells according to various embodiments of the inventions. Compared to FIG. 6, the second ferromagnetic layer 114 (MMT) couples to multiple first ferromagnetic layers 112, and is used directly as a connection conductor for series coupling between sense element cells. By doing so, the electrical coupling path is lowered significantly, as are the parasitic effects from the coupling path. In a preferred embodiment, each second ferromagnetic layer 114 (MMT) couples to two first ferromagnetic layers 112. Such an arrangement would be beneficial for a balanced sense current flow because each sense element cell has equal SNR weighting.

FIGS. 8A-8C show a comparison between cross-section views of typical Z-axis TMR element cells and Z-axis TMR element cells according to various embodiments of the inventions. The cross-section views extend to multiple TMR element cells. For clarity, some components such as the second ferromagnetic layers 114, the insulating tunnel barriers 116, etc., are not shown in FIGS. 8A-8C. The flux guides 118 are high aspect ratio vertical bars made from a high permeability magnetic material with ends terminating in close proximity to opposed edges of the TMR sense elements (i.e., the first ferromagnetic layers 112). A flux guide 118 captures magnetic flux from an applied field oriented in the Z-axis direction, and bends the field lines to have a horizontal component near the ends of the flux guide 118. The first ferromagnetic layer 112 responds only to in-plane magnetic fields, and therefore, does not respond to a Z-axis magnetic field directly. The flux guide 118 bends the Z-axis magnetic field into a horizontal direction such that the first ferromagnetic layer 112 may respond accordingly.

FIG. 8A depicts a cross-section view of TMR sense element cells and flux guides for two adjacent typical Z-axis TMR element cells. Each TMR sense element cell only comprises one flux guide 118, which is placed asymmetrically between two neighbor sense element cells (i.e., the first ferromagnetic layers 112). Because of the asymmetry, a subtractive effect arises between the flux guide 118 and the farther sense element cell (this interaction is depicted with the (-) symbol in FIG. 8A. While smaller in magnitude due to the distance from the flux guide edge, the Z-axis field conversion from the farther sense element cell (in-plane component) is opposite to and subtracts from the in-plane component of the Z-axis field conversion for the neighbor sense element cell.

FIGS. 8B and 8C show cross-section views of TMR sense element cells and flux guides for two different types of Z-axis TMR element cells according to various embodiments of the inventions. In FIG. 8B, dual flux guide trenches 118a and 118b instead of a single wide flux guide 118c (FIG. 8C) are utilized. The dual flux guide trenches 118a and 118b are located, disposed, or deposited symmetrically between neighbor sense element cells (i.e., first ferromagnetic layers 112). Furthermore, the dual flux guide trenches 118a and 118b (with the gap between the dual flux guide trenches) cover the whole space between the neighbor sense element cells widthwise. Such an arrangement decouples requirements on sense element pitch, MMT spacing, and trench width, allowing for optimal use of all. In FIG. 8C, a wide trench flux guide 118c is located, disposed, or deposited symmetrically between the neighbor sense element cells (i.e., first ferromagnetic layers 112), and covers the whole space between the neighbor sense element cells widthwise. Although the dual flux guide trenches 118a and 118b and wide trench flux guide 118c are shown below the first ferromagnetic layers 112 in FIGS. 8B and 8C, the dual flux guide trenches 118a and 118b and wide trench flux guide 118c may also be located, disposed, or deposited above the first ferromagnetic layers 112. In one embodiment, the flux guides shown in FIGS. 8A-8C are fabricated with a thin ferromagnetic material layer 119 coated on both sides of the trench to respond to a Z-axis magnetic field.

FIG. 9 shows a schematic diagram of a TMR magnetic field sensor 200 according to various embodiments of the inventions. The magnetic field sensor 200 comprises a first bridge circuit 220 powered by a voltage source 300 connected via a voltage source connection 300a, and a second circuit 400 powered by an optional reset field source 500, which may be a current source connected via a reset field source connection 500a. The first bridge circuit 220 comprises a plurality of TMR transducer legs 210 (or a plurality of Z-axis TMR transducer legs 310). The bridge circuit 220 may be a half bridge circuit, a full bridge circuit, or any combinations thereof. In one embodiment, the bridge circuit 220 is a Wheatstone bridge circuit having two circuit branches with a bridge output signal 260 between the two branches at some intermediate point along the branches. The TMR transducer leg 210 (or the Z-axis TMR transducer leg 310) electrically functions as a resistor with its resistance value variable in response to internal and external magnetic fields. The current line 410 of each TMR element cell 100 (or Z-axis TMR element cell 311) routes together with various routing patterns to form the second circuit 400.

Figure 10A:
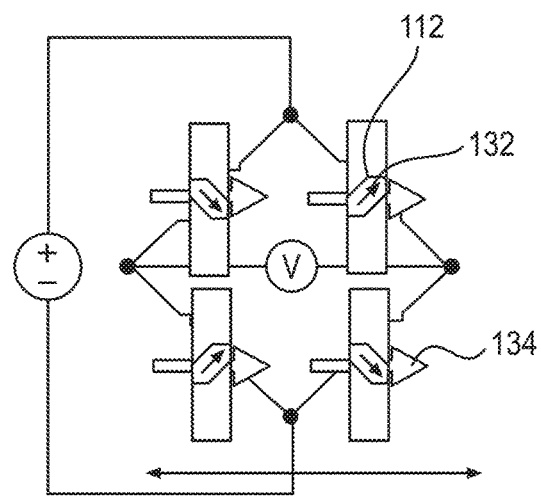
FIGS. 10A-10B depict exemplary diagrams of bridge circuit for measurement of X- or Y-axes of a magnetic field according to various embodiments of the inventions.
Figure 10B:
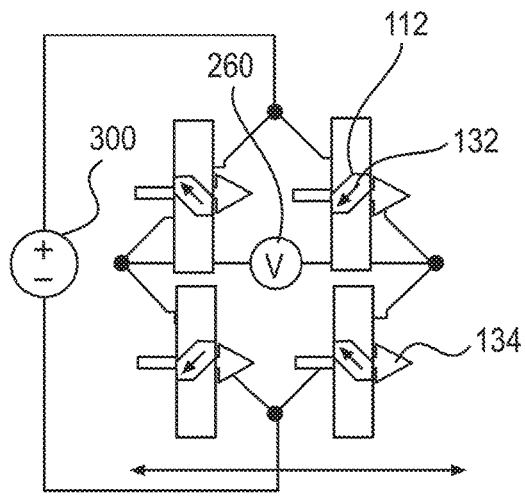

FIGS. 10A and 10B depict exemplary diagrams of bridge circuits for measurement of X- or Y-axes of a magnetic field, with the current lines energized, according to various embodiments of the inventions. When a reset current is applied to the current line 410 of FIG. 1, for example, a magnetic field pulse with a magnetization direction 132 is generated on the first ferromagnetic layer 112. Depending on the polarity of the applied current pulse, the generated magnetic field switches the free layer direction 132 to have a component that is positively or negatively aligned to the reference magnetization direction 134 of the second ferromagnetic layer. FIG. 10A shows a generally positively aligned magnetization direction 132 in the first ferromagnetic layer 112, and FIG. 10B shows a generally negatively aligned magnetization direction 132 in the first ferromagnetic layer 112.

Figure 11A:
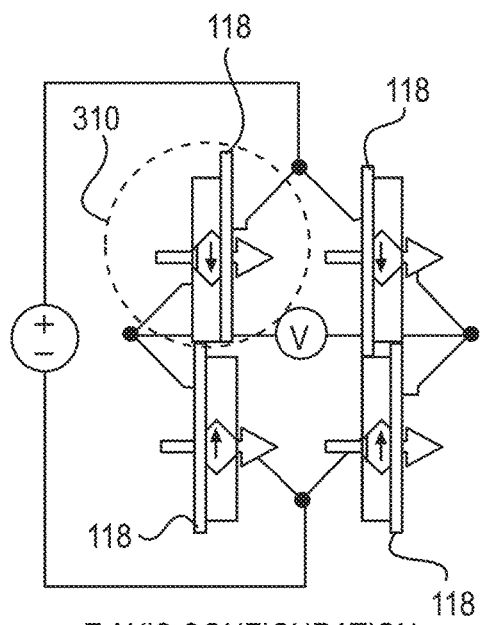
FIGS. 11A-11B depict exemplary diagrams of bridge circuits for measurement of a Z-axis magnetic field according to various embodiments of the inventions.
Figure 11B:
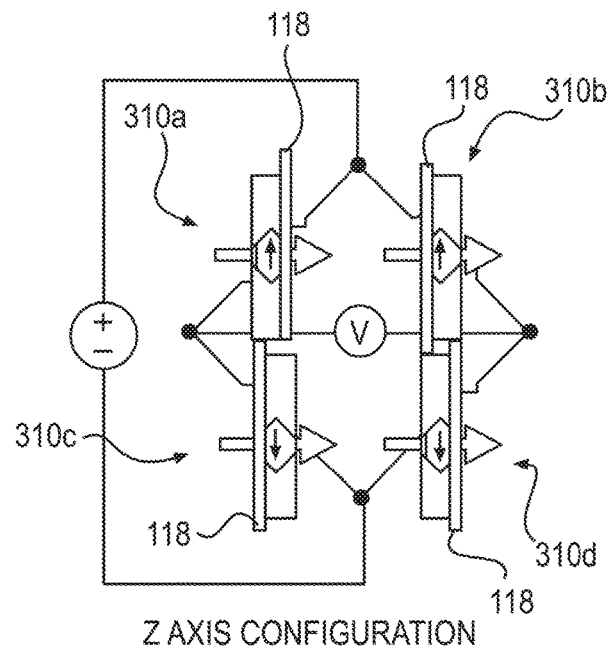

FIGS. 11A and 11B depict exemplary diagrams of bridge circuits for measurement of a Z-axis of a magnetic field, with current lines energized, according to various embodiments of the inventions. FIGS. 11A and 11B show two exemplary Z-axis bridge configurations, with different sense element magnetizations. It is understood that the flux guides 118 shown in FIGS. 11A and 11B are only for a general illustration purpose. It is referred to as a collection of the flux guides within each Z-axis TMR transducer leg 310. Each Z-axis TMR transducer lea 310a, 310b, 310c, and 310d may also have different magnetizations other than the pattern shown in FIGS. 11A and 11B.

Figure 12:
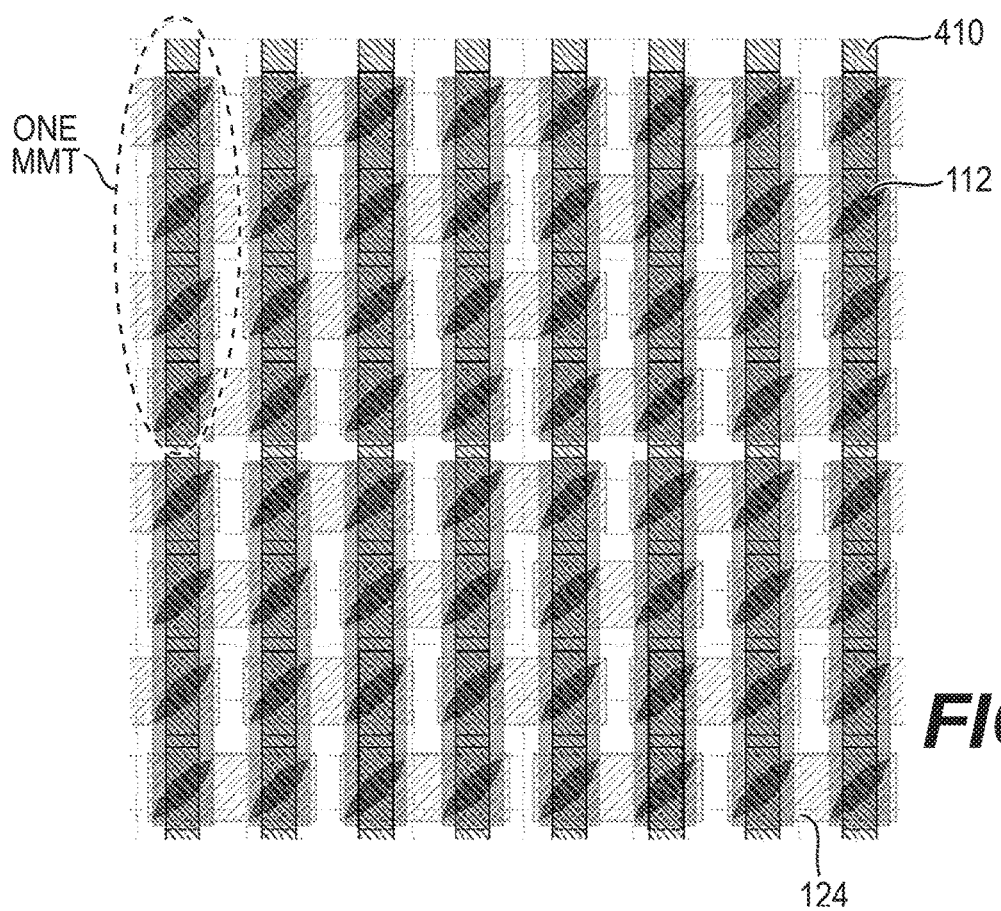
FIG. 12 depicts an exemplary structure diagram of an array of X/Y-axis TMR element cells according to various embodiments of the inventions.

FIG. 12 depicts an exemplary structure diagram of an array of X/Y-axis TMR element cells according to various embodiments of the inventions. The reset line 410 has a 45 degree cross angle to the first ferromagnetic layers 112. Such a reset line routing will have a relatively lower switching threshold and only need half of a reset current to switch the magnetization directions of the first ferromagnetic layers 112 as compared to a 90 degree reset line routing. In one embodiment, four sense element cells may share a common reference layer (MMT) for balanced sense current flow, whereby each TMR element cell has equal SNR weighting. The element cells are electrically connected via a horizontal link (e.g., the first conductive line 124 shown in FIGS. 5 and 7). Each horizontal link 124 couples a pair within a row of elements to a pair in the adjacent row.

Figure 13:
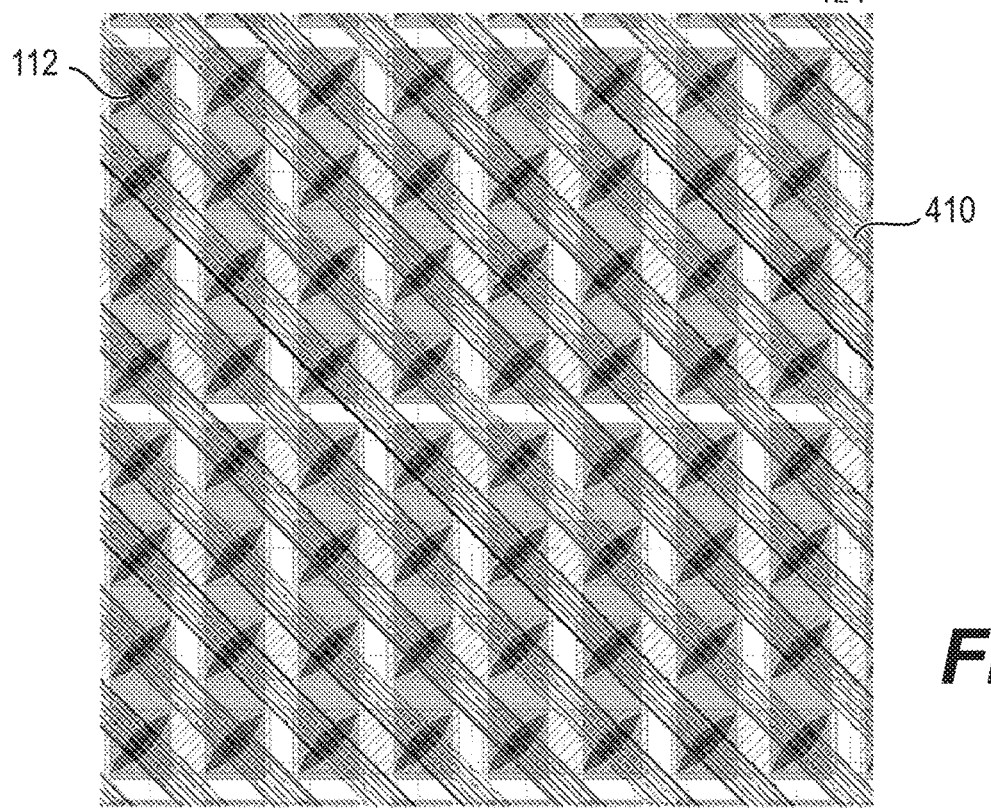
FIG. 13 depicts a second exemplary structure diagram of an array of X/Y-axis TMR element cells according to various embodiments of the inventions.

FIG. 13 shows a second exemplary structure diagram of an array of X/Y-axis TMR element cells according to various embodiments of the inventions. The reset line 410 has a 90 degree cross angle to the first ferromagnetic layers 112. The 90 degree reset line routing pattern needs a relatively higher reset current threshold to switch a magnetization direction of the first ferromagnetic layers 112 compared to the 45 degree reset line routing pattern, but in some configurations, the 90 degree reset line routing pattern is more robust. The 90 degree reset line routing pattern may be used for applications with a relatively higher power budget for the TMR sensor.

FIG. 14 shows an exemplary structure diagram of an array of Z-axis TMR element cells according to various embodiments of the inventions. Dual flux guides trenches 118a and 118b are used for optimal trench width while maintaining TJ pitch and spacing constraints. In one embodiment, a single wide flux guide 118c (not shown) may also be used instead of the configuration of dual flux guide trenches 118a and 118b. Similar to FIG. 8B, the Z-axis TMR element cells on each row are electrically connected via a horizontal link 124 through a sense element (i.e., first ferromagnetic layer 112) to a second ferromagnetic layer 114 (MMT), which may be connected in a desired pattern to construct the final TMR sensor. In one embodiment, a row 1030 of Z-axis TMR element cells have an opposite response to an out-of-plane field (Z-axis field) as compared to a neighboring row 1040 of Z-axis TMR element cells. For example, the TMR element cells of row 1030 may have an increasing resistance response, but the TMR element cells of row 1040 may have a decreasing resistance response. Therefore, the TMR element cells of the same row may be bundled together and act as a bridge leg (310) or a part of a bridge leg for the bridge circuit 220 (shown in FIG. 9).

FIGS. 15A-15C depict exemplary schematic diagrams of an array of Z-axis TMR element cells according to various embodiments of the inventions. FIG. 15A shows a Wheatstone bridge circuit 1100 with each bridge leg 1110, 1120, 1130, and 1140 representing a row (or multiple rows) of Z-axis TMR element cells. The Wheatstone bridge circuit 1100 is coupled between a voltage source Vdd and a ground GND with diagonal bridge legs having a same response to an out-of-plane field (Z-axis field). The voltage difference between the middle points m1 and m2 is the output of the Wheatstone bridge circuit 1100. The Wheatstone bridge circuit 1100 may be constructed of different TMR element cell interleaving patterns. FIG. 15B shows a parallel interleaving pattern, and FIG. 15C shows a parallel interleaving pattern of longer serpentine paths for optimal total transducer resistance.

In FIG. 15B, each bridge leg corresponds to a row or parallel grouping of rows of TMR element cells disclosed in FIGS. 11A and 11B. The first leg 1110 and third leg 1130 form one path between the voltage source Vdd and ground GND. The second leg 1120 and fourth leg 1140 form another path between the voltage source Vdd and ground GND. Each bridge leg corresponds to a row of TMR element cells. The first leg 1110 and third leg 1130 have opposite responses to an out-of-plane field (Z-axis field). The second leg 1120 and fourth leg 1140 have opposite responses to an out-of-plane field (Z-axis field). Moreover, the first leg 1110 and second leg 1120 have opposite responses to an out-of-plane field (Z-axis field). The interleaving pattern is designed to ensure a maximum output between the between the middle points m1 and m2, and a dense spatial fill without subtractive effects from adjacent sense element cells and flux guides outlined previously. In one embodiment, a TMR magnetic field sensor may comprise multiple such interleaving patterns coupled in parallel between the voltage source and ground.

In FIG. 15C, each bridge leg corresponds to multiple rows of TMR element cells in series connection and the number of rows included within each bridge leg is the same. Moreover, the TMR element cells within each bridge leg have the same response to a Z-axis magnetic field. Similar to FIG. 15B, the four bridge legs 1110-1140 establish the Wheatstone bridge circuit 1100 to ensure a maximum output between the between the middle points m1 and m2. Although each bridge leg consists of three rows of TMR element cells, as shown in FIG. 15C, it is understood that the bridge leg may consist of any desired odd number rows of TMR element cells. In a preferred embodiment, the bridge leg may comprise rows of TMR element cells for a bridge circuit output resistance in the order of 10 kΩ in order to balance power consumption and Johnson noise.

Figure 16:
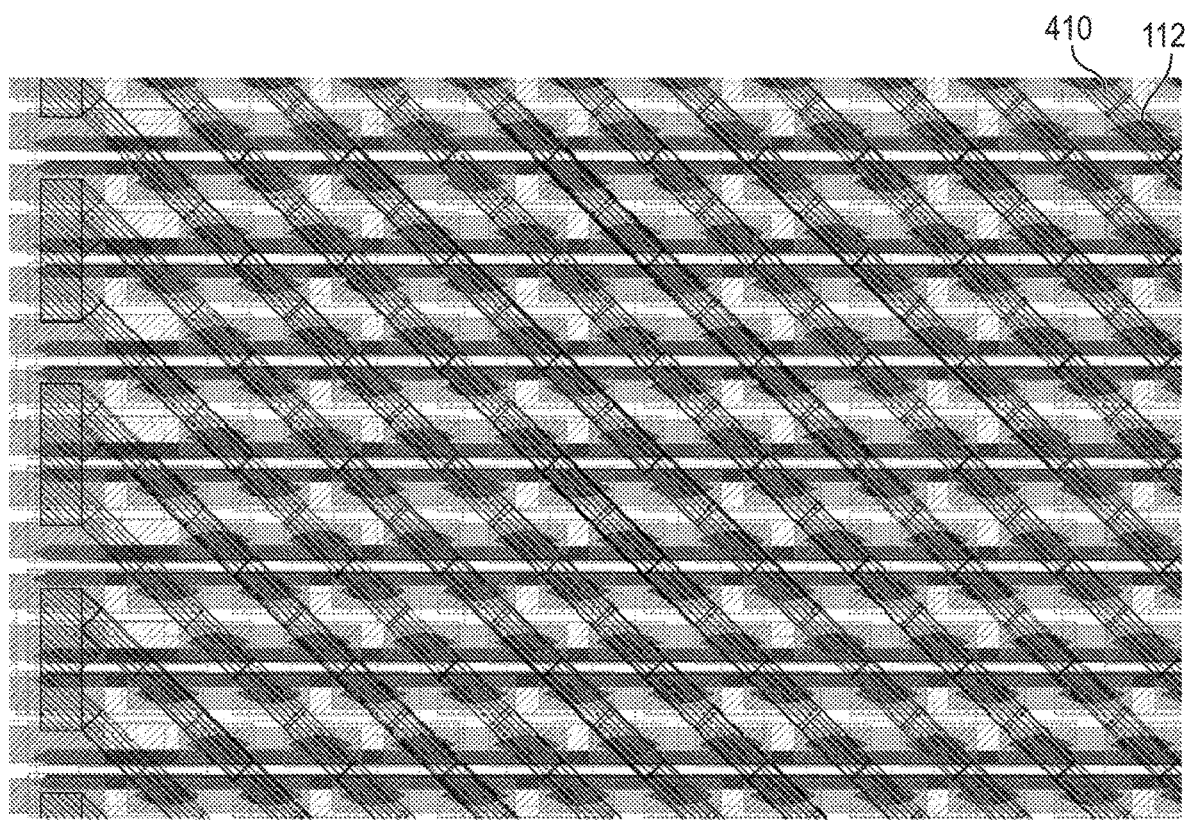
FIG. 16 depicts an exemplary schematic diagram of an array of Z-axis TMR element cells, with 45 degree reset current lines, according to various embodiments of the inventions.

FIG. 16 depicts an exemplary schematic diagram of an array of Z-axis TMR element cells with 45 degree reset current lines according to various embodiments of the inventions. The reset line 410 has a 45 degree cross angle to the first ferromagnetic layers 112. A 90 degree reset line routing pattern needs a relatively higher reset current threshold to switch a magnetization direction of the first ferromagnetic layers 112 compared to the 45 degree reset line routing pattern. However, the 90 degree reset line routing pattern is more robust for some configurations. The 90 degree reset line routing pattern may be used for applications with a relatively higher power budget for the TMR sensor.

One skilled in the art will recognize that various implementations may be realized within the described architecture, all of which fall within the scope of the inventions. For example, various reset current line routing and/or energizing methods may be implemented in the TMR magnetic field sensors. For example, a bipolar reset current may be applied to the reset current line to lower 1/f noise of the magnetic sensor. The bipolar reset current may be applied in addition to the reset current line routing patterns disclosed in the aforementioned embodiments. Moreover, the reset current line routing patterns may not be limited to the aforementioned illustrated embodiments.

The foregoing description of the inventions has been described for purposes of clarity and understanding. It is not intended to limit the inventions to the precise form disclosed. Various modifications may be possible within the scope and equivalence of the application.

What is claimed is:

1. A magnetic field sensor, comprising:
a plurality of magnetoresistance sense elements coupled together as a first circuit to sense a magnetic field, wherein each magnetoresistance sense element of the plurality of magnetoresistance sense elements includes a first ferromagnetic layer and a second ferromagnetic layer separated by an insulating barrier layer; and
a conductive line coupling a first ferromagnetic layer of a first magnetoresistance sense element and a first ferromagnetic layer of a second magnetoresistance sense element,
wherein the first magnetoresistance sense element and a third magnetoresistance sense element of the plurality of magnetoresistance sense elements share a common second ferromagnetic layer such that a first portion of the common second ferromagnetic layer is above either the first ferromagnetic layer of the first magnetoresistance sense element or a first ferromagnetic layer of the third magnetoresistance sense element and a second portion of the common second ferromagnetic layer is below the other of the first ferromagnetic layer of the first magnetoresistance sense element or the first ferromagnetic layer of the third magnetoresistance sense element.

2. The magnetic field sensor of claim 1, further comprising:
   at least one flux guide located between the first and second magnetoresistance sense elements, wherein the at least one flux guide is located above or below the first and second magnetoresistance sense elements.

3. The magnetic field sensor of claim 1, further comprising a plurality of flux guides, and wherein the plurality of flux guides are located above or below the first and second magnetoresistance sense elements.

4. The magnetic field sensor of claim 1, further comprising:
   at least one flux guide located between the first and second magnetoresistance sense elements, wherein the at least one flux guide is located above or below the first and second magnetoresistance sense elements, and wherein the at least one flux guide includes a thin ferromagnetic material layer on both sides of the at least one flux guide.

5. The magnetic field sensor of claim 1,
   wherein, when a magnetic field is sensed by the plurality of magnetoresistance sense elements, a sense current flows through the first ferromagnetic layer, the insulating barrier layer, and the second ferromagnetic layer of a magnetoresistance sense element, and wherein a direction of the sense current flow is perpendicular to the conductive line.

6. The magnetic field sensor of claim 1, further comprising:
   at least one flux guide located between the first and second magnetoresistance sense elements, wherein the at least one flux guide is located above or below the first and second magnetoresistance sense elements, wherein the at least one flux guide is located symmetrically between the first and second magnetoresistance sense elements, and wherein a width of the at least one flux guide covers a whole width between the first and second magnetoresistance sense elements.

7. The magnetic field sensor of claim 1, further comprising a plurality of flux guides, wherein the plurality of flux guides are located above or below the first and second magnetoresistance sense elements, and wherein at least one flux guide of the plurality of flux guides is located symmetrically between the first and second magnetoresistance sense elements.

8. The magnetic field sensor of claim 1, further comprising:
   at least one flux guide located between the first and second magnetoresistance sense elements, wherein the at least one flux guide is located above or below the first and second magnetoresistance sense elements, and wherein the at least one flux guide is located relatively closer to the first magnetoresistance sense element than to the second magnetoresistance sense element.

9. The magnetic field sensor of claim 1, further comprising a plurality of flux guides, wherein the plurality of flux guides are located above or below the first and second magnetoresistance sense elements, and wherein at least one flux guide of the plurality of flux guides includes a high permeability magnetic material.

10. The magnetic field sensor of claim 1, wherein the first ferromagnetic layer of each magnetoresistance sense element includes a magnetization direction free to rotate in a magnetic field, and wherein the second ferromagnetic layer of each magnetoresistance sense element includes a fixed magnetization direction.

11. The magnetic field sensor of claim 1, wherein the plurality of magnetoresistance sense elements includes one or more tunneling magnetoresistance sense elements, giant magnetoresistance sense elements, and/or anisotropic magnetoresistance sense elements.

12. The magnetic field sensor of claim 1, further comprising:
    a second circuit comprising a plurality of current lines, wherein each current line of the plurality of current lines is adjacent to, above, or below a corresponding magnetoresistance sense element of the plurality of magnetoresistance sense elements.

13. The magnetic field sensor of claim 1, further comprising:
    a second circuit comprising a plurality of current lines, wherein each current line of the plurality of current lines is adjacent to, above, or below a corresponding magnetoresistance sense element of the plurality of magnetoresistance sense elements,
    wherein at least one current line of the plurality of current lines is positioned at either a 45 degree cross angle or a 90 degree cross angle relative to a first ferromagnetic layer of a magnetoresistance sense element of the plurality of magnetoresistance sense elements.

14. The magnetic field sensor of claim 1, further comprising:
    at least one flux guide located between the first and second magnetoresistance sense elements, wherein the at least one flux guide includes a first flux guide and a second flux guide, wherein the first flux guide is located above the first and second magnetoresistance sense elements, and wherein the second flux guide is located below the first and second magnetoresistance sense elements.

15. A magnetic field sensor, comprising:
    a plurality of magnetoresistance sense elements coupled together as a first circuit to sense a magnetic field, wherein each of the plurality of magnetoresistance sense elements includes a first ferromagnetic layer and a second ferromagnetic layer separated by an insulating barrier layer, wherein the plurality of magnetoresistance sense elements includes at least a first magnetoresistance sense element and a second magnetoresistance sense element located in a plane;
    a conductive line coupling a first ferromagnetic layer of the first magnetoresistance sense element and a first ferromagnetic layer of the second magnetoresistance sense element; and
    a plurality of flux guides, wherein a first flux guide of the plurality of flux guides is located between the first and second magnetoresistance sense element and above or below the first magnetoresistance sense element,
    wherein the first magnetoresistance sense element and a third magnetoresistance sense element of the plurality of magnetoresistance sense elements are coupled via a first common ferromagnetic layer that extends between the first and third magnetoresistance sense elements,
    wherein the second magnetoresistance sense element and a fourth magnetoresistance sense element of the plurality of magnetoresistance sense elements are coupled via a second common ferromagnetic layer that extends between the second and fourth magnetoresistance sense elements, wherein the first common ferromagnetic layer and the second common ferromagnetic layer are spaced apart, and wherein, when a magnetic field is sensed by the plurality of magnetoresistance sense elements, a sense current flows through the first ferromagnetic layer, the insulating barrier layer, and the second ferromagnetic layer of a magnetoresistance sense element, and wherein a direction of the sense current flow is perpendicular to each current line of a plurality of current lines that is adjacent to the corresponding magnetoresistance sense element of the plurality of magnetoresistance sense elements.

16. The magnetic field sensor of claim 15, wherein the first common ferromagnetic layer includes first and second portions, wherein the first portion of the common ferromagnetic layer is above or below a ferromagnetic layer of the first magnetoresistance sense element, and wherein the second portion of the common ferromagnetic layer is above or below a ferromagnetic layer of the third magnetoresistance sense element.

17. The magnetic field sensor of claim 15, wherein the first flux guide is positioned between the first and second magnetoresistance sense elements, wherein each flux guide of the plurality of flux guides is configured to direct a portion of a magnetic field oriented orthogonally to the plane of first and second magnetoresistance sense elements into the plane of the first and second magnetoresistance sense elements, wherein the first flux guide is configured to direct the magnetic field into the plane in a first direction, and wherein a second flux guide of the plurality of flux guides is configured to direct the magnetic field into the plane in a second direction opposite the first direction.

18. A magnetic field sensor, comprising:

a plurality of magnetoresistance sense elements coupled together as a first circuit to sense a magnetic field, wherein each magnetoresistance sense element of the plurality of magnetoresistance sense elements includes a first ferromagnetic layer and a second ferromagnetic layer separated by an insulating barrier layer;

a second circuit comprising a plurality of current lines, wherein each current line of the plurality of current lines is adjacent to a corresponding magnetoresistance sense element of the plurality of magnetoresistance sense elements, wherein the first magnetoresistance sense element and a third magnetoresistance sense element of the plurality of magnetoresistance sense elements share a common second ferromagnetic layer such that a first portion of the common second ferromagnetic layer is above or below the first ferromagnetic layer of the first magnetoresistance sense element and a second portion of the common second ferromagnetic layer is above or below the first ferromagnetic layer of the third magnetoresistance sense element, wherein, when a magnetic field is sensed by the plurality of magnetoresistance sense elements, a sense current flows through the first ferromagnetic layer, the insulating barrier layer, and the second ferromagnetic layer of a magnetoresistance sense element, and wherein a direction of the sense current flow is perpendicular to each current line of the plurality of current lines that is adjacent to the corresponding magnetoresistance sense element of the plurality of magnetoresistance sense elements.

19. The magnetic field sensor of claim 18, wherein at least one current line of the plurality of current lines is positioned above or below a magnetoresistance sense element, and wherein the at least one current line of the plurality of current lines is positioned at either a 45 degree or a 90 degree cross angle relative to a first ferromagnetic layer of a magnetoresistance sense element of the plurality of magnetoresistance sense elements.

20. The magnetic field sensor of claim 18, wherein the first ferromagnetic layer of the first magnetoresistance sense element and the first ferromagnetic layer of the third magnetoresistance sense element are spaced apart.

* * * * *